United States Patent [19]

Yokoyama et al.

[11] Patent Number: 5,743,936
[45] Date of Patent: Apr. 28, 1998

[54] METHOD OF RECOVERING VALUABLES FROM PRINTED WIRING BOARD HAVING ELECTRONIC COMPONENTS MOUNTED THEREON

[75] Inventors: Sadahiko Yokoyama; Masatoshi Iji, both of Tokyo, Japan

[73] Assignee: NEC Corporation, Tokyo, Japan

[21] Appl. No.: 649,486

[22] Filed: May 17, 1996

[30] Foreign Application Priority Data

May 19, 1995 [JP] Japan .................... 7-121495

[51] Int. Cl.$^6$ .................................. C22B 3/00
[52] U.S. Cl. .................... 75/403; 29/426.4; 29/426.5
[58] Field of Search ................... 75/403; 29/426.4, 29/426.5

[56] References Cited

U.S. PATENT DOCUMENTS

| | | | |
|---|---|---|---|
| 5,375,318 | 12/1994 | Catalano | 29/762 |
| 5,456,738 | 10/1995 | Gil | 75/403 |
| 5,547,134 | 8/1996 | Rubenstein | 241/23 |

FOREIGN PATENT DOCUMENTS

| | | | |
|---|---|---|---|
| A 4130531 | 3/1992 | Germany . | |
| A 4227568 | 11/1994 | Germany . | |
| 56-37693 | 4/1981 | Japan . | |
| 288725 | 3/1990 | Japan . | |

OTHER PUBLICATIONS

Ibold, et al., "Stand und Möglichkeiten des Electronikschrott–Recycling", Erzmetall 47 (1994) Nr. 9, pp. 554–561.

Klaus Feldmann et al., "Disassembly of electronic products", *Institute of Electrical and Electronics Engineers, Inc.*, 94CH3386-9, May, 1993, pp. 81–86.

*Primary Examiner*—Melvyn Andrews
*Attorney, Agent, or Firm*—Sughrue, Mion, Zinn, Macpeak & Seas, PLLC

[57] ABSTRACT

The method of recovering valuables from a printed wiring board on which electronic components are mounted, includes the steps of (a) removing electronic components from a printed wiring board on which the electronic components are mounted, (b) polishing a surface of the printed wiring board from which the electronic components have been removed in the step (a), (c) milling the printed wiring board a surface of which has been polished in the step (b), and (d) separating milled portions of the printed wiring board into portions mainly including copper and portions mainly including resin and filler. The electronic components recovered in accordance with the method includes valuables such as gold having greater grade than natural minerals. The copper recovered in accordance with the method includes no impurities such as solder, and thus can be reclaimed as metal resource having high added value. The residual glass fiber and resin scarcely includes impurities such as solder, and thus can be reused as a filler to be used for building materials and construction materials.

18 Claims, 1 Drawing Sheet

METHOD OF RECOVERING VALUABLES FROM PRINTED WIRING BOARD HAVING ELECTRONIC COMPONENTS MOUNTED THEREON

BACKGROUND OF THE INVENTION

1. Field of the Invention

The invention relates to a method of recovering electronic components as valuables from a printed wiring board on which the electronic components have been mounted, recovering solder from the printed wiring board from which electronic components have been recovered, and recovering copper, resin and filler from the printed wiring board from which the electronic components and solder have been recovered.

2. Description of the Related Art

Various methods have been proposed for recovering valuables from a printed wiring board which are mainly composed of filler, resin and metal and on which electronic components are mounted. For instance, Japanese Unexamined Patent Publication No. 2-88725 has suggested a method including the steps of heating to thereby carbonize resin components contained in composite material of which a printed wiring board is made, and recovering valuables such as copper.

Further, there has been proposed an attempt for recovering metal by milling a printed wiring board, and then carrying out screening, magnetic separation and electrostatic separation in the article: S. Kato, N. Rokukawa and H. Sakamoto, "Separation of Metals from Printed Wiring Boards Mounted Electronic Components", Shigen, Vol. 4, No. 1, pp. 583–590, 1992.

For still another instance, Japanese Unexamined Patent Publication No. 56-37693 has suggested a method including the steps of heating a printed wiring board on which electronic components are mounted, up to a solder melting point or greater within a rotary kiln to thereby separate solder and a part of the electronic components from a substrate, milling the substrate and residual electronic components, and carrying out screening to thereby recover metals and glass fibers.

In addition, K. Feldmann and H. Scheller have suggested a disassembling machine for printed circuit boards in "Disassembly of electronic products", International Symposium on Electronics & the Environment sponsored by IEEE, May 2–4, 1994, pp. 81–86.

In the method suggested in Japanese Unexamined Patent Publication No. 2-88725, various types of exhaust gas are generated, and hence there has to be constructed a facility for disposing such exhaust gas. In addition, valuable metal components contained in a printed wiring board tend to be oxidized, and hence there is a fear that added values of recovered metals are reduced.

In the method suggested by S. Kato et al., much of the metals such as solder, are mixed as impurities with a metal which is to be recovered. Thus, it is impossible to recover high grade valuables from a printed wiring board with high yield.

In accordance with the method suggested in Japanese Unexamined Patent Publication No. 56-37693, a part of solder and electronic components are removed before milling a printed wiring board. However, since it is not possible to completely recover all the solder and electronic components from a printed wiring board only by heating to thereby melt the solder in a rotary kiln, much of the metals such as solder are mixed as impurities with recovered metals, similarly to the method suggested by S. Kato et al.

As will be obvious from the foregoing, there has been long sought after a method of minimizing an amount of impurities which is to be contained in recovered metals and making it possible to recover high grade valuables from a printed wiring board with high yield.

SUMMARY OF THE INVENTION

It is an object of the present invention to provide a method of recovering valuables from a printed wiring board on which electronic components are mounted, which method minimizes an amount of impurities which may be contained in recovered metals and makes it possible to recover high grade valuables with high yield.

The present invention provides a method of recovering valuables from a printed wiring board on which electronic components are mounted, including the steps of (a) removing electronic components from a printed wiring board on which the electronic components are mounted, (b) polishing a surface of the printed wiring board from which the electronic components have been removed in the step (a), (c) milling the printed wiring board a surface of which has been polished in the step (b), and (d) separating milled portions of the printed wiring board into portions mainly including copper and portions mainly including materials other than copper such as resin and filler.

The present invention further provides a method of recovering valuables from a printed wiring board on which electronic components are mounted, including the steps of (a) removing electronic components from a printed wiring board on which the electronic components are mounted, (b) applying an external force consisting of a frictional force and/or a shearing force to a surface of the printed wiring board from which the electronic components have been removed in the step (a), to separate and recover solder from printed wiring board, (c) milling the printed wiring board a surface of which has been polished in the step (b), and (d) separating milled portions of the printed wiring board into portions mainly including copper and portions mainly including materials other than copper.

The present invention still further provides a method of recovering valuables from a printed wiring board on which electronic components are mounted, including the steps of (a) removing electronic components from a printed wiring board on which the electronic components are mounted, (b) polishing a surface of the printed wiring board from which the electronic components have been removed in the step (a), the step (b) including a combination of steps (b1) and (b2), the step (b1) including the step of applying an external force consisting of a frictional force and/or a shearing force to a surface of the printed wiring board from which the electronic components have been removed in the step (a), to separate and recover solder from the printed wiring board, and the step (b2) including the steps of (b2-1) heating the printed wiring board up to a solder melting point or greater, and (b2-2) applying an external force including at least an impact force to the heated printed wiring board to separate and recover solder from the printed wiring board, (c) milling the printed wiring board a surface of which has been polished in the step (b), and (d) separating milled portions of the printed wiring board into portions mainly including copper and portions mainly including materials other than copper.

The above mentioned steps (b1), (b2-1) and (b2-2) may be carried out in either this order or the order of (b2-1), (b2-2)

and (b1). For instance, the step (b2-1) may be carried out by means of an infrared radiation heater, and the printed wiring board is heated up to a temperature preferably in the range of 190° C. to 250° C. both inclusive in the step (b2-1).

The application of the external force consisting of a frictional force and/or a shearing force to a surface of the printed wiring board may be carried out in various ways. For instance, the application of the external force to a surface of a printed wiring board has the steps of preparing a buff including flexible material having a surface to which abrasive material is applied, moving the buff at high speed, and compressing a surface of the printed wiring board to the abrasive material of the buff. As an alternative, the application of the external force includes the steps of preparing a buff comprising flexible material, moving the buff at high speed, and compressing a surface of the printed wiring board to the buff with abrasive material or fluid including abrasive material dispersed therein being provided to an interface of the printed wiring board and the buff. The application of the external force to a surface of a printed wiring board may include the step of compressing a metal having a sharpened edge and moving at high speed to a surface of the printed wiring board, or may include the steps of preparing a polishing device having a surface formed thereon with narrow grooves, moving the polishing device at high speed, and compressing a surface of the printed wiring board to the surface of the polishing device. As an alternative, the application of the external force may include the steps of preparing a polishing device having a surface formed thereon with narrow grooves, moving the polishing device at high speed, and compressing a surface of the printed wiring board to the surface of the polishing device with abrasive material or fluid including abrasive material dispersed therein being provided to an interface of the printed wiring board and the polishing device.

Herein, a term "a printed wiring board" means one on which electronic components are mounted and which are usually used for electrical devices. Herein, a term "electronic components mounted on a printed board" means components constituting a usual electrical circuit, such as an integrated circuit, a resistance, a capacitor, a diode, a connector and a transducer.

Herein, a term "solder" means one to be used in electronic industries, which has a characteristic of melting at a specific temperature or greater and which adheres electronic components to a printed wring board to thereby electrically connect the electronic components to a circuit pattern formed on a printed wiring board. Though Sn—Pb family alloy is usually used as solder in electronic industries, the solder used for the present invention includes alloy other than Sn—Pb alloy, as well as Sn—Pb alloy. In addition, there may be used an adhesive made of resin compound or inorganic compound, which has a characteristic of melting or decomposing at a specific temperature or greater, similarly to solder.

The method to be carried out in accordance with the present invention essentially comprises the steps of removing electronic components from a printed wiring board on which said electronic components are mounted, polishing a surface of the printed wiring board, milling the printed wiring board, and separating milled portions of the printed wiring board into portions mainly including copper and portions mainly including materials other than copper such as resin and filler. Other steps may be carried out just prior to or subsequently to each of the above mentioned electronic components removing step, surface polishing step, milling step and separating step.

Hereinbelow will be explained the step of polishing a surface of the printed wiring board in detail. In this polishing step, an external force consisting of a frictional force and/or a shearing force is applied to a surface of a printed wiring board from which electronic components have been removed, thereby separating and recovering solder from the printed wiring board. This step may be carried out in a variety of ways.

For instance, there is first prepared a buff including flexible material such as cloth, leather and paper which has a surface to which abrasive material such as alumina, silica, iron oxide, chrome oxide and silicon carbide is applied. Then, a surface of the printed wiring board is compressed to the abrasive material of the buff which are moving or rotating at high speed to thereby apply a frictional force for polishing to the surface of the printed wiring board.

As an alternative, the application of the external force to a surface of a printed wiring board may be carried out by providing abrasive material or fluid including abrasive material dispersed therein to a gap to be formed between the above mentioned buff and a surface of a printed wiring board. Thus, a frictional force is applied to a surface of a printed wiring board, thereby the surface being polished. Herein, the above mentioned fluid includes water and organic solvent.

A brush or blade made of stainless steel which is rotating or moving at high speed may be compressed to a surface of a printed wiring board to thereby apply a shearing force to the surface for polishing.

As an alternative, the application of the external force to a surface of a printed wiring board may be carried out by preparing a polishing device having a surface formed thereon with narrow grooves, moving or rotating the polishing device at high speed, and compressing a surface of a printed wiring board to a surface of the polishing device. A frictional force is applied to a surface of a printed wiring board, thereby to the surface being polished. Abrasive material or fluid including abrasive material dispersed therein may be provided during polishing into an interface of a surface of a printed wiring board and with the polishing device moving or rotating at high speed.

The above mentioned surface polishing step may be constructed of the combined two steps. One includes applying an external force consisting of a frictional force and/or a shearing force to a surface of a printed wiring board from which the electronic components have been removed in the electronic components removing step, to thereby separate and recover solder from the printed wiring board. The other includes heating a printed wiring board up to a solder melting point or greater, and applying an external force including at least an impact force to the heated printed wiring board to thereby separate and recover solder from the printed wiring board. The application of the external force to a surface of a printed wiring board may be carried out in many ways as mentioned earlier. For heating a printed wiring board to a solder melting point or greater, there may be used various heaters such as an electric furnace, an infrared radiation heater, a far infrared radiation heater, an induction heater. However, other types of heaters may be used unless they can heat a printed wiring board up to a solder melting point or greater.

The application of the external force including an impact force to a heated printed wiring board may be carried out, for instance, by a rotating hammer, a hammer swinging like a pendulum, a rotating blade, a piston, and a ball made of metal or ceramics. It is preferable that the impact force is applied to an upper surface of a printed wiring board on which electronic components are mounted, a lower surface or a side surface perpendicular to the upper surface. It is preferable that the impact force is perpendicularly applied to the upper, lower or side surface.

The above mentioned combined two steps constituting the surface polishing step may be carried out in two orders. In one order, the frictional force and/or shearing force is applied to a printed wiring board to thereby separate solder from the printed wiring board, then the printed wiring board is heated up to a solder melting point or greater, and then the impact force is applied to the printed wiring board to thereby separate residual solder from the printed wiring board. In the other order, a printed wiring board is heated up to a solder melting point or greater, then the impact force is applied to the printed wiring board to thereby separate solder from the printed wiring board, and then the frictional and/or shearing force is applied to the printed wiring board to thereby separate residual solder from the printed wiring board. The same advantageous effects can be obtained by carrying out the steps in either of the above mentioned two orders.

In accordance with the method of the present invention, it is possible to recover most of electronic components and solder from a printed wiring board in the electronic components removing step, recover residual solder in the surface polishing step, and recover milled powder containing much of copper (hereinafter, referred to as "copper-rich powder") and milled powder containing resin and glass fibers (hereinafter, referred to as "glass fiber and resin powder") in the separation step. In accordance with the surface polishing step, it is possible to separate solder which could not be separated in the electronic components removing step, and hence, it is possible to prevent residual solder from being mixed in the copper-rich powder and the glass fiber and resin powder both of which can be obtained through the milling and separating steps to be carried out subsequently to the surface polishing step.

The thus recovered electronic components contain valuables such as gold which has quite a higher grade than that of natural mineral. Hence, it is possible to reclaim the recovered electronic components as metal resources.

The recovered electronic components can be divided into groups each containing identical valuables by utilizing magnetic force or in dependence on a difference in shape. Thus, it is possible to recover specific valuables through the milling and separating steps. It is also possible to reuse recovered electronic components.

The recovered copper is not oxidized unlike copper which has experienced a resin carbonization step, and does not contain impurities such as solder mixed thereinto. Hence, the recovered copper can be reused as metal resources having high added value. Since the residual glass fiber and resin powder contains quite a little amount of impurities such as solder mixed thereinto, it can be used as a filler for building material. It is of course possible to reuse the recovered solder as metal resources.

In accordance with the present invention, it is possible to recover valuables from all parts constituting a printed wiring board, which was difficult or almost impossible by the prior art.

The above and other objects and advantageous features of the present invention will be made apparent from the following description made with reference to the accompanying drawing, in which like reference characters designate the same or similar parts throughout the drawing.

DESCRIPTION OF THE PREFERRED EMBODIMENTS

Figure 1:
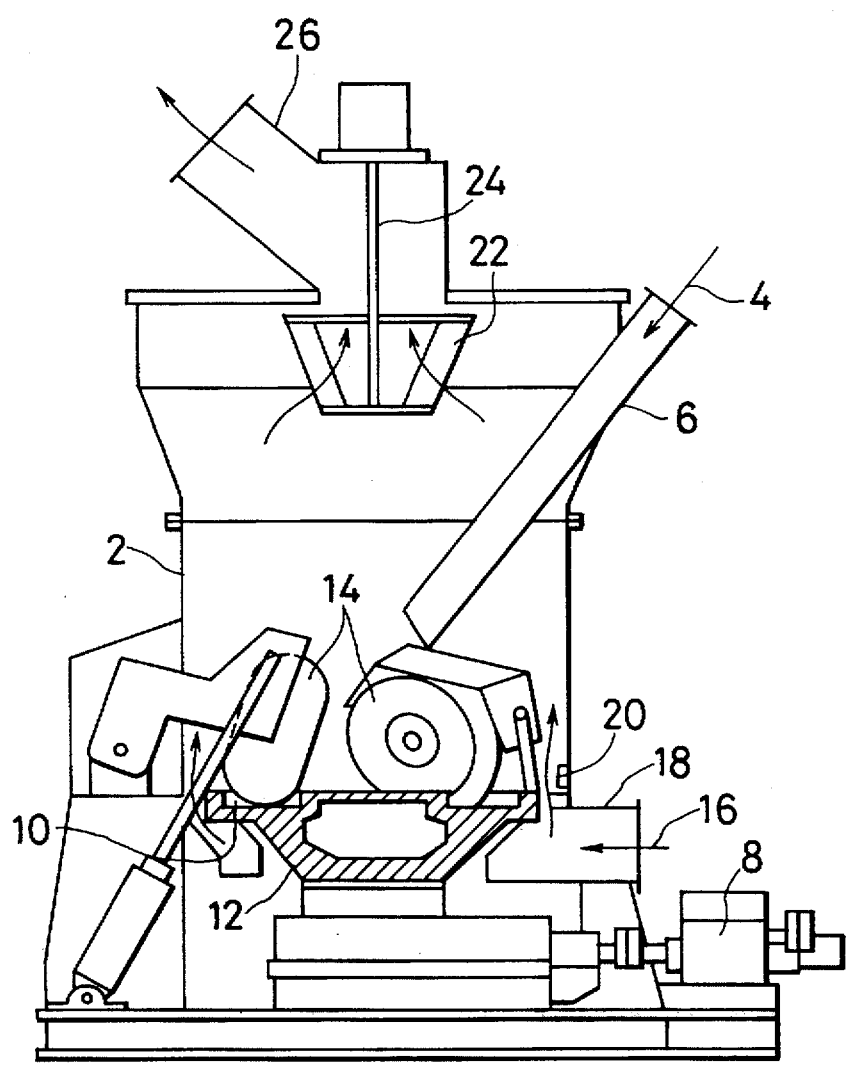
FIG. 1 is a cross-sectional view of a roller mill having a rotary blade type classifier, which mill is to be used in a milling step of the method of the present invention.

Preferred embodiments in accordance with the present invention will be explained hereinbelow with reference to drawings.

In the embodiments described below, there was used as a sample a printed wiring board made of glass fiber reinforced epoxy resin and formed thereon with a pattern made of copper. On the printed wiring board are mounted electronic components such as an integrated circuit package and a connector. Hereinbelow, the above mentioned printed wiring board is referred to simply as "a components-mounting board". The printed wiring board contains copper at 30 weight %, and the components-mounting board contains solder at 8.8 weight %.

The embodiments 1 to 5 of the present invention are listed in Table 1, and references 1 to 3 are listed in Table 2. Tables 1 and 2 indicate surface polishing conditions, recovery rate of copper, content rates of copper and solder in finally obtained copper-rich powder, and content rate of solder in glass fiber and resin powder. Herein, the recovery rate of copper is defined as follows:

Recovery rate of copper=(Amount of copper in copper-rich powder)/(Total amount of copper in a printed wiring board)

TABLE 1

| | EMBODIMENTS | | | | |
| --- | --- | --- | --- | --- | --- |
| | 1 | 2 | 3 | 4 | 5 |
| Apparatus used in the surface polishing step | Buff Polisher | Brush-type Polisher | Buff Polisher + Brush-type Polisher | Buff Polisher + Reflow appa. + Charpy Impact Tester | Reflow appa. + Charpy Impact Tester + Brush-type Polisher |
| Recovery Rate of Cu | 96 | 97 | 95 | 95 | 96 |
| Content Rate of Cu in Cu-rich powder | 94 | 92 | 91 | 93 | 92 |
| Content Rate of Solder in Cu-rich powder | 0.086 | 0.097 | 0.077 | 0.065 | 0.068 |
| Content Rate of Solder in glass fiber & resin powder | 0.082 | 0.094 | 0.072 | 0.059 | 0.065 |

Unit: Weight Percent

TABLE 2

| | REFERENCES | | |
| --- | --- | --- | --- |
| | 1 | 2 | 3 |
| Method used in the surface polishing step | Nothing (a board is milled without removing components and polishing) | Nothing (after removal of components, a board is milled) | Impingement of alumina powder to a board |
| Recovery rate of copper | 84 | 92 | 91 |
| Content rate of | 82 | 89 | 88 |

TABLE 2-continued

| | REFERENCES | | |
|---|---|---|---|
| | 1 | 2 | 3 |
| copper in copper-rich powder | | | |
| Content rate of solder in copper-rich powder | 6.8 | 2.9 | 2.7 |
| Content rate of solder in glass fiber and resin powder | 5.9 | 2.4 | 2.1 |

Unit: Weight Percent

In the electronic components removing step of the embodiment, the components-mounting board was first heated to thereby melt a solder used in the components-mounting board. Then, an external force including an impact force and a shearing force was applied to the components-mounting board to thereby remove electronic components from the components-mounting board by means of an apparatus for removing electronic components from a printed wiring board. Such an apparatus is disclosed in Japanese Patent Application No. 7-23066 filed by the assignee of the present invention, and not published yet.

The electronic components removing step of the embodiment will be detailed hereinbelow. The electronic components removing step includes a heating step of heating solder up to a melting point, and a components removing step of removing electronic components from a printed wiring board by applying an external force including an impact force, oscillation and/or a shearing force to at least one of an upper surface of a printed wiring board on which electronic components are mounted and which has solder thereon being melted by heating, a lower surface and a side surface. The electronic components removing step essentially includes the above mentioned heating step and components removing step, but may include other steps prior to or subsequently to those two steps. The heating step may be carried out concurrently with the components removing step.

In the heating step, the components-mounting board is heated to thereby melt a solder used on the components-mounting board. As a heat source may be used an infra-red radiation heater, hot air, heat of condensation in inert organic solvent, and eddy current generated by high frequency wave. Among them, an infra-red radiation heater is preferable as a heat source. For the purpose of sufficiently melting a solder, a temperature to which solder is to be heated is set to be greater than a melting point of solder. It is preferable to set such a temperature in the range of 190° C. to 250° C. both inclusive.

In the components removing step, an external force including an impact force, oscillation and/or a shearing force is applied to at least one of an upper surface of a printed wiring board on which electronic components are mounted, a lower surface, and a side surface to thereby remove a lot of electronic components from a printed wiring board at one time. In the components removing step, an impact force, oscillation and a shearing force may be concurrently or alternately applied to electronic components. As an alternative, one of an impact force, oscillation and a shearing force may be applied to electronic components. It is preferable that such an external force is applied to an upper surface of a printed wiring board perpendicularly thereto or in parallel therewith. An impact force may be applied to a printed wiring board by freely falling a components-mounting board or hitting an upper, lower or side surface of a components-mounting board with a rotary blade or hammer.

When a components-mounting board is to freely fall, it is preferable to cause a components-mounting board to fall perpendicularly to a ground. When a rotary blade or a hammer is to be used for hitting a components-mounting board, it is preferable to perpendicularly hit an upper, lower or side surface of a components-mounting board. When a shearing force is to be applied to a printed wiring board, for instance, an upper surface of a printed wiring board on which electronic components are mounted is swept with a plate or a brush made of metal to thereby scrape electronic components from a printed wiring board. It should be noted that it is necessary to carry out the components removing step just subsequently to the heating step by which solder is molten. Thus, it would be effective to carry out the heating step concurrently with the components removing step, for instance, by freely falling a printed wiring board into a heating furnace.

The above mentioned steps make it possible to effectively remove a lot of electronic components from a components-mounting board at a time regardless of shape, location, size and other conditions of a components-mounting board and electronic components.

In the surface polishing step of the embodiment 1, a frictional force was applied to a printed wiring board by means of a buff polisher in which a buff having a belt-like sheet on which alumina powder is adhered as abrasive material is made to rotate at high speed, thereby separating and recovering solder from a printed wiring board from which electronic components have been removed. In the surface polishing step of the embodiment 2, a shearing force was applied to a printed wiring board by means of a polisher in which a brush made of stainless steel is made to rotate at high speed (hereinafter, referred to as "a brush-type polisher"). In the surface polishing step of the embodiment 3, both a frictional force and a shearing force were applied to a printed wiring board by means of the above mentioned buff polisher and brush-type polisher.

In the surface polishing step of the embodiment 4, a frictional force was applied to a printed wiring board by means of the above mentioned buff polisher, and then the printed wiring board is heated up to a solder melting point or greater by means of a solder reflow apparatus utilizing a infra-red radiation heater. Further, an impact force is applied perpendicularly to a side surface of a printed wiring board by means of a Charpy impact tester to be used for measuring impact strength of plastics. Thus, an upper surface of a printed wiring board from which electronic components have been removed in the component removing step was polished. Then, heat and an impact force are applied to a printed wiring board to thereby separate and recover solder.

In the surface polishing step of the embodiment 5, a printed wiring board was first heated up to a solder melting point or greater by means of the above mentioned solder reflow apparatus, and then an impact force was applied perpendicularly to a side surface of a printed wiring board by means of the above mentioned Charpy impact tester. Further, a frictional force was applied to a printed wiring board by means of the above mentioned brush-type polisher, followed by application of heat and an impact force to a printed wiring board from which electronic components have been removed. Thus, solder was separated and recovered from a printed wiring board.

In the milling step of the embodiment, there were used a shearing type pulverizer and a compressing and shearing type pulverizer to thereby mill a printed wring board having already experienced the surface polishing step so that milled portions have average size of about 150 μm. Herein, a shearing type pulverizer includes a hammer mill which carries out pulverizing with a combination of a rotating hammer, a fixed blade in a chamber and a screen disposed at an exit, and a disc mill which carries out pulverizing with pins or grooves of rotating discs facing to each other.

As a compressing and shearing type pulverizer for applying an external force including a compressing force and a shearing force to an object to thereby mill the object, there may be used a pulverizer having a rotating table formed circumferentially with a groove or grooves and a milling roller to which hydraulic pressure is applied. In operation, powder obtained after pulverizing a components-mounting board by using the above mentioned shearing type pulverizer is clamped between the groove and the milling roller, and an external force including a compressing force and a shearing force is applied to the board to thereby pulverize the board. In addition, for the purpose of milling the object into particles having a diameter suitable for separation, it is preferable to control a diameter of particles and then collect particles having a controlled diameter. To this end, for instance, there may be carried out steps of blowing particles up with air current, and collecting particles having a predetermined diameter or smaller. In order to carry out these steps, it is preferable to prepare a machine having a mechanism for blowing up particles above a pulverizer with air current, and a mechanism for collecting only particles having a predetermined diameter or smaller by rotating a rotary shaft disposed above the pulverizer and having a plurality blades for classification. In the present invention, it is preferable to use the pulverizer having the mechanisms mentioned above as a compressing and shearing type pulverizer. For instance, there may be used a roller mill having thereabove a classifier which collects particles having a predetermined diameter or smaller by rotating a rotary shaft having a plurality of classification blades therearound. Such a roller mill is commercially available from IHI (Ishikawajima Harima Industry).

FIG. 1 schematically illustrates the above mentioned roller mill. The illustrated roller mill comprises a casing 2, an introduction tube 6 which is secured to a sidewall of the casing 2 and through which an object to be milled is introduced into a milling chamber, a milling table 12 which is made to rotate by a motor 8 and which is formed circumferentially with a groove 10, a plurality of milling rollers 14 hydraulically compressed onto the groove 10, a conduit 18 through which air is provided for producing ascending current in the casing 2, a nozzle 20 which is in communication with the conduit 18 and through which the ascending current is blown up, a rotary shaft 24 disposed above the milling rollers 14 and having a plurality of classification blades 22, and a discharge conduit 26 through which only particles having a predetermined diameter or smaller are introduced outside. The discharge conduit 26 may be designed to move air therethrough. Among those parts, the conduit 18, the nozzle 20, the classification blades 22 and the rotary shaft 24 constitute a classifier (not numbered).

In operation, the milling table 12 is first made to rotate, and then a plurality of the milling rollers 14 are hydraulically compressed onto the milling table 12. An object 4 to be milled is caught and thereby milled between the milling rollers 14 and the groove 10 of the milling table 12. The thus milled object, namely particles, are discharged outside the milling table 12. Then, the particles are carried upward with ascending current blowing up through the nozzle 20 to the outside the milling table 12, and then classified in the classifier.

Coarse particles having a diameter greater than a predetermined diameter are brought back onto the milling table 12, and then milled again together with a newly coming object 4.

In the above mentioned milling step of the embodiment, there is used a roller mill integral with a classifier having rotary blades, but there may be used a roller mill and a separate classifier having rotary blades both of which cooperate to constitute a closed circuit.

In the separating step of the embodiment, there were carried out gravity separation by using an air current centrifugal separator and electrostatic separation by using a combination type electrostatic separator. In the gravity separation, the particles produced in the milling step are divided into particles containing much of copper and particles containing glass fiber and resin. The latter particles are recovered as the earlier mentioned glass fiber and resin powder. Then, copper contained in the former particles is condensed by electrostatic separation, and recovered as copper-rich powder. The gravity separation was carried out on the condition that a weight ratio of particles having a greater specific gravity to particles having a smaller specific gravity became 50/50 after particles have been gravity-separated. A gravity separator was adjusted so that the above mentioned weight ratio could be obtained.

In the reference 1, a components-mounting board was milled in the same way as the above embodiments without removing electronic components, and copper-rich powder and glass fiber and resin powder were recovered in the same way as the embodiments.

In the reference 2, electronic components were removed in the same way as the above embodiments, and a printed wiring board was milled in the same way as the embodiments without surface polishing. Then, copper-rich powder and glass fiber and resin powder were recovered in the same way as the embodiments.

In the reference 3, electronic components were removed in the same way as the above embodiments. Then, alumina powder is made to impinge at high speed to an upper surface of a printed wiring board to thereby apply an impact force to the board. Hereinafter, the printed wiring board was milled, and copper-rich powder and glass fiber and resin powder were recovered in the same way as the embodiments.

As will be obvious in view of comparison between the embodiments 1 to 5 and the references 1 to 3, it is understood that the present invention makes it possible to recover high grade copper with high yield, and to reduce solder content rate in copper-rich powder and glass fiber and resin powder. In particular, since glass fiber and resin powder contains solder at quite low content, it is possible to reclaim glass fiber and resin powder as a filler to be used for building material and construction material.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A method of recovering valuables from a printed wiring board on which electronic components are mounted, comprising the steps of:

(a) removing electronic components from a printed wiring board on which said electronic components are mounted;

(b) polishing a surface of said printed wiring board from which said electronic components have been removed in said step (a);

(c) milling said printed wiring board a surface of which has been polished in said step (b) into milled portions, wherein said milled portions comprise portions mainly including copper and portions mainly including materials other than copper; and (d) separating said milled portions of said printed wiring board into said portions mainly including copper and said portions mainly including materials other than copper.

2. The method as set forth in claim 1, wherein said materials in said step (d) includes resin and filler.

3. A method of recovering valuables from a printed wiring board on which electronic components are mounted, comprising the steps of:

(a) removing electronic components at least some having been mounted using solder, from a printed wiring board;

(b) applying an external force consisting of a frictional force and/or a shearing force to a surface of said printed wiring board from which said electronic components have been removed in said step (a), to separate and recover solder from said printed wiring board;

(c) milling said printed wiring board after said external force has been applied in said step (b), into milled portions, wherein said milled portions comprise portions mainly including copper and portions mainly including materials other than copper; and (d) separating said milled portions of said printed wiring board into said portions mainly including copper and said portions mainly including materials other than copper.

4. The method as set forth in claim 3, wherein said step (b) includes the steps of preparing a buff comprising flexible material having a surface to which abrasive material is applied, moving said buff at high speed, and compressing said surface of said printed wiring board to said abrasive material of said buff.

5. The method as set forth in claim 3, wherein said step (b) includes the steps of preparing a buff comprising flexible material, moving said buff at high speed, and compressing a surface of said printed wiring board to said buff with abrasive material or fluid including abrasive material dispersed therein being provided to an interface of said printed wiring board and said buff.

6. The method as set forth in claim 3, wherein said step (b) includes the step of compressing a metal having a sharpened edge and moving at high speed to a surface of said printed wiring board.

7. The method as set forth in claim 3, wherein said step (b) includes the steps of preparing a polishing device having a surface formed thereon with narrow grooves, moving said polishing device at high speed, and compressing said surface of said printed wiring board to said surface of said polishing device.

8. The method as set forth in claim 3, wherein said step (b) includes the steps of preparing a polishing device having a surface formed thereon with narrow grooves, moving said polishing device at high speed, and compressing a surface of said printed wiring board to said surface of said polishing device with abrasive material or fluid including abrasive material dispersed therein being provided to an interface of said printed wiring board and said polishing device.

9. A method of recovering valuables from a printed wiring board on which electronic components are mounted, comprising the steps of:

(a) removing electronic components at least some having mounted using solder, from a printed wiring board;

(b) polishing a surface of said printed wiring board from which said electronic components have been removed in said step (a), said step (b) including a combination of steps (b1) and (b2), said step (b1) including the step of applying an external force consisting of a frictional force and/or a shearing force to said surface of said printed wiring board from which said electronic components have been removed in said step (a), to separate and recover solder from said printed wiring board, and said step (b2) including the steps of (b2-1) heating said printed wiring board up to a solder melting point or greater, and (b2-2) applying an external force including at least an impact force to the heated printed wiring board to separate and recover solder from said printed wiring board;

(c) milling said printed wiring board a surface of which has been polished in said step (b) into milled portions, wherein said milled portions comprise portions mainly including copper and portions mainly including materials other than copper; and (d) separating said milled portions of said printed wiring board into said portions mainly including copper and said portions mainly including materials other than copper.

10. The method as set forth in claim 9, wherein said steps (b1), (b2-1) and (b2-2) are carried out in this order.

11. The method as set forth in claim 9, wherein said steps (b2-1), (b2-2) and (b1) are carried out in this order.

12. The method as set forth in claim 9, wherein said step (b2-1) is carried out by means of an infrared radiation heater.

13. The method as set forth in claim 9, wherein said printed wiring board is heated up to a temperature in the range of 190° C. to 250° C. both inclusive.

14. The method as set forth in claim 9, wherein said step (b1) includes the steps of preparing a buff comprising flexible material having a surface to which abrasive material is applied, moving said buff at high speed, and compressing a surface of said printed wiring board to said abrasive material of said buff.

15. The method as set forth in claim 9, wherein said step (b1) includes the steps of preparing a buff comprising flexible material, moving said buff at high speed, and compressing a surface of said printed wiring board to said buff with abrasive material or fluid including abrasive material dispersed therein being provided to an interface of said printed wiring board and said buff.

16. The method as set forth in claim 9, wherein said step (b1) includes the step of compressing a metal having a sharpened edge and moving at high speed to a surface of said printed wiring board.

17. The method as set forth in claim 9, wherein said step (b1) includes the steps of preparing a polishing device having a surface formed thereon with narrow grooves, moving said polishing device at high speed, and compressing a surface of said printed wiring board to said surface of said polishing device.

18. The method as set forth in claim 9, wherein said step (b1) includes the steps of preparing a polishing device having a surface formed thereon with narrow grooves, moving said polishing device at high speed, and compressing a surface of said printed wiring board to said surface of said polishing device with abrasive material or fluid including abrasive material dispersed therein being provided to an interface of said printed wiring board and said polishing device.

* * * * *